United States Patent
Cai et al.

(10) Patent No.: US 10,535,410 B2
(45) Date of Patent: *Jan. 14, 2020

(54) HYBRID READ DISTURB COUNT MANAGEMENT

(71) Applicant: SK hynix Inc., Gyeonggi-do (KR)

(72) Inventors: Yu Cai, San Jose, CA (US); Fan Zhang, Fremont, CA (US); June Lee, Sunnyvale, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/191,082

(22) Filed: Nov. 14, 2018

(65) Prior Publication Data

US 2019/0096492 A1    Mar. 28, 2019

Related U.S. Application Data

(63) Continuation of application No. 15/162,270, filed on May 23, 2016, now Pat. No. 10,147,500.

(60) Provisional application No. 62/165,770, filed on May 22, 2015.

(51) Int. Cl.
| | |
|---|---|
| *G06F 11/00* | (2006.01) |
| *G11C 16/34* | (2006.01) |
| *G11C 16/26* | (2006.01) |
| *G11C 29/44* | (2006.01) |
| *G11C 29/42* | (2006.01) |
| *G11C 29/52* | (2006.01) |
| *G06F 11/07* | (2006.01) |

(Continued)

(52) U.S. Cl.
CPC ........ *G11C 16/3431* (2013.01); *G06F 11/073* (2013.01); *G06F 11/076* (2013.01); *G06F 12/0246* (2013.01); *G11C 16/26* (2013.01); *G11C 16/349* (2013.01); *G11C 29/42* (2013.01); *G11C 29/44* (2013.01); *G11C 29/52* (2013.01); *G06F 2201/81* (2013.01); *G06F 2201/88* (2013.01); *G11C 2029/0409* (2013.01)

(58) Field of Classification Search
CPC ............ G11C 16/3427; G11C 16/3422; G11C 16/3418; G11C 16/0483; G11C 16/10; G11C 11/5642; G06F 11/106; G06F 11/1072; G06F 12/0246
See application file for complete search history.

(56) References Cited

U.S. PATENT DOCUMENTS

| | | | | |
|---|---|---|---|---|
| 5,488,702 A | * | 1/1996 | Byers ................... | G06F 11/1004 714/807 |
| 6,240,016 B1 | * | 5/2001 | Haddad ................. | G11C 16/26 365/185.17 |

(Continued)

*Primary Examiner* — Bryce P Bonzo
*Assistant Examiner* — Jeison C Arcos
(74) *Attorney, Agent, or Firm* — Kilpatrick Townsend & Stockton LLP (57) ABSTRACT

Memory systems may include a memory including a plurality of blocks, and a controller suitable for counting, with a counter, a number of reads to a block of the plurality of blocks, updating wordline information of a plurality of wordlines in the counted block when the number of reads exceeds a block read count threshold, selecting a wordline from the plurality of wordlines, determining an error rate of a neighbor wordline to the selected wordline, and reclaiming data in the block when the error rate exceeds an error threshold.

20 Claims, 7 Drawing Sheets

(51) Int. Cl.
*G06F 12/02* (2006.01)
*G11C 29/04* (2006.01)

(56) References Cited

U.S. PATENT DOCUMENTS

| | | | |
|---|---|---|---|
| 6,628,545 B1* | 9/2003 | Li | G11C 16/3404 |
| | | | 365/185.05 |
| 7,050,252 B1 | 5/2006 | Vallis | |
| 7,212,435 B2* | 5/2007 | Rudeck | G11C 16/10 |
| | | | 365/185.02 |
| 7,471,565 B2* | 12/2008 | Aritome | G11C 16/3418 |
| | | | 365/185.17 |
| 7,808,831 B2 | 10/2010 | Mokhlesi et al. | |
| 7,898,861 B2* | 3/2011 | Aritome | G11C 16/3427 |
| | | | 365/185.17 |
| 9,613,687 B2 | 4/2017 | Kim et al. | |
| 2006/0002167 A1* | 1/2006 | Rudeck | G11C 16/10 |
| | | | 365/101 |
| 2006/0198221 A1* | 9/2006 | Rudeck | G11C 16/10 |
| | | | 365/206 |
| 2008/0049494 A1* | 2/2008 | Aritome | G11C 16/3418 |
| | | | 365/185.02 |
| 2009/0046507 A1* | 2/2009 | Aritome | G11C 16/3418 |
| | | | 365/185.02 |
| 2009/0251971 A1* | 10/2009 | Futatsuyama | G11C 16/344 |
| | | | 365/185.22 |
| 2009/0323412 A1* | 12/2009 | Mokhlesi | G11C 11/5642 |
| | | | 365/185.02 |
| 2011/0185251 A1* | 7/2011 | d'Abreu | G06F 11/1072 |
| | | | 714/752 |
| 2012/0054582 A1* | 3/2012 | Byom | G06F 11/1072 |
| | | | 714/773 |
| 2012/0069674 A1 | 3/2012 | Lee | |
| 2012/0127804 A1 | 5/2012 | Ong et al. | |
| 2013/0007353 A1 | 1/2013 | Shim et al. | |
| 2013/0016558 A1 | 1/2013 | Ahn et al. | |
| 2013/0173970 A1 | 7/2013 | Kleveland et al. | |
| 2013/0212431 A1 | 8/2013 | Ong | |
| 2014/0082411 A1 | 3/2014 | Warnes | |
| 2014/0136884 A1* | 5/2014 | Werner | G06F 11/2094 |
| | | | 714/6.11 |
| 2015/0355845 A1* | 12/2015 | Lee | G06F 3/0679 |
| | | | 711/103 |
| 2016/0104539 A1* | 4/2016 | Kim | G11C 16/28 |
| | | | 365/185.12 |
| 2016/0307635 A1* | 10/2016 | Kim | G11C 16/28 |

* cited by examiner

HYBRID READ DISTURB COUNT MANAGEMENT

CROSS-REFERENCE TO RELATED APPLICATIONS

This application is a continuation of U.S. patent application Ser. No. 15/162,270 filed on May 23, 2016, which claims the benefit of U.S. Provisional Application No. 62/165,770 filed May 22, 2015. The disclosure of each of the foregoing applications is incorporated herein by reference in its entirety.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

As memory requirements increase, performance and reliability of memory devices becomes increasingly important. Thus, there exists a need for improved performance and reliability of memory devices.

SUMMARY

Aspects of the invention include systems. The systems may include a memory including a plurality of blocks, and a controller suitable for counting, with a counter, a number of reads to a block of the plurality of blocks, updating wordline information of a plurality of wordlines in the counted block when the number of reads exceeds a block read count threshold, selecting a wordline from the plurality of wordlines, determining an error rate of a neighbor wordline to the selected wordline, and reclaiming data in the block when the error rate exceeds an error threshold.

Further aspects of the invention include methods. The methods may include counting, with a counter, a number of reads to a block of a plurality of blocks of a memory, updating, with a controller, wordline information of a plurality of wordlines in the counted block when the number of reads exceeds a block read count threshold, selecting, with the controller, a wordline from the plurality of word lines, determining, with the controller, an error rate of a neighbor wordline to the selected wordline, and reclaiming data in the block when the error rate exceeds an error threshold.

Additional aspects of the invention include memory devices. The memory devices may include a memory including a plurality of blocks, and a controller configured to count, with a counter, a number of reads to a block of the plurality of blocks, update wordline information of a plurality of wordline in the counted block when the number of reads exceeds a block read count threshold, select a wordline from the plurality of wordlines, determine an error rate of a neighbor wordline to the selected wordline, and reclaim data in the block when the error rate exceeds an error threshold.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
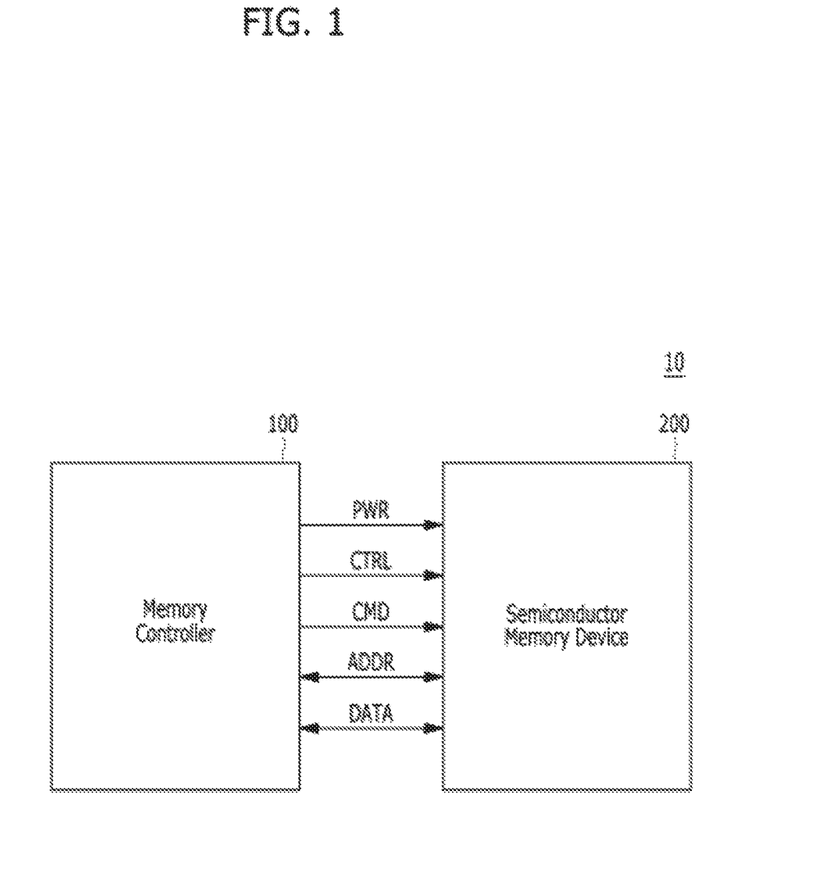
FIG. 1 is a block diagram schematically illustrating a memory system in accordance with an embodiment of the present invention.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
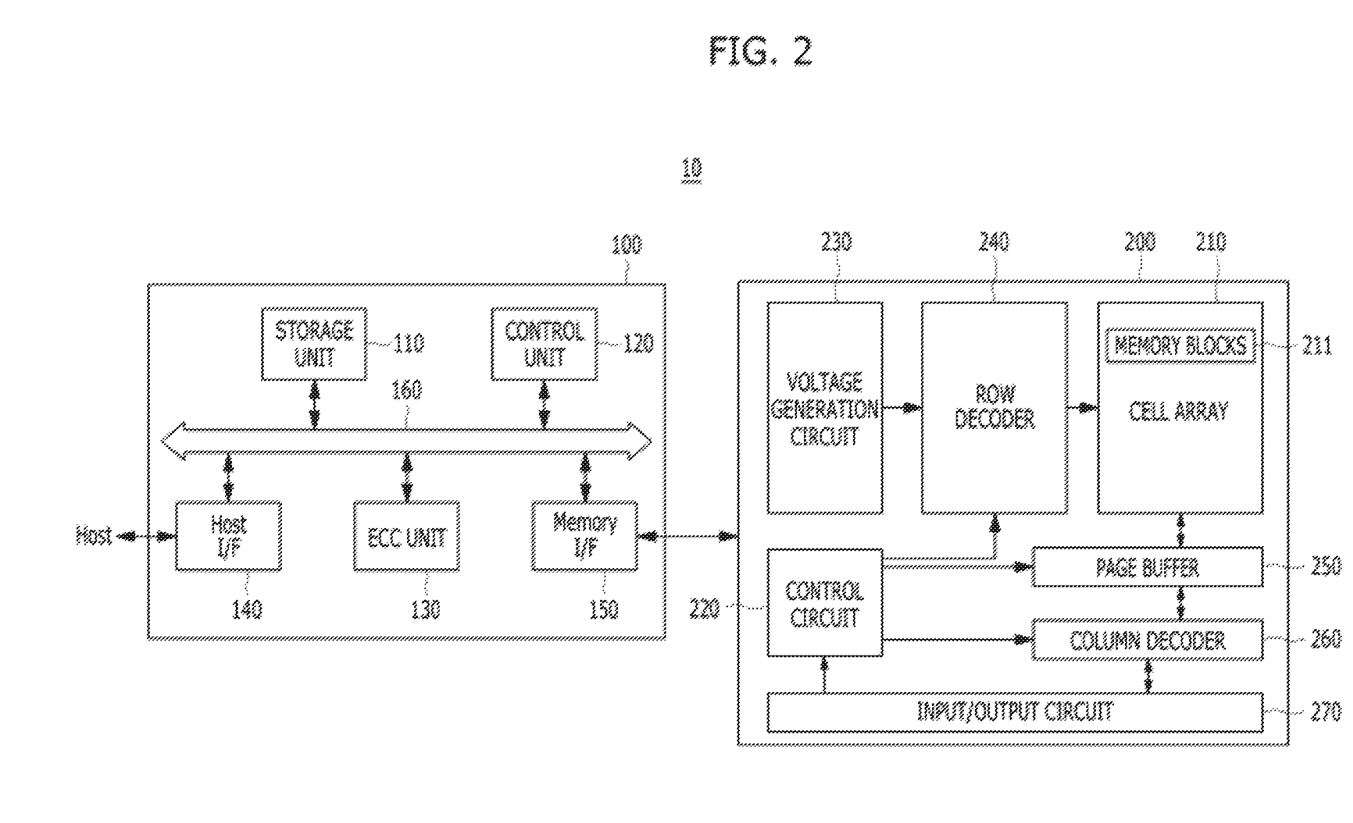
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDDC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
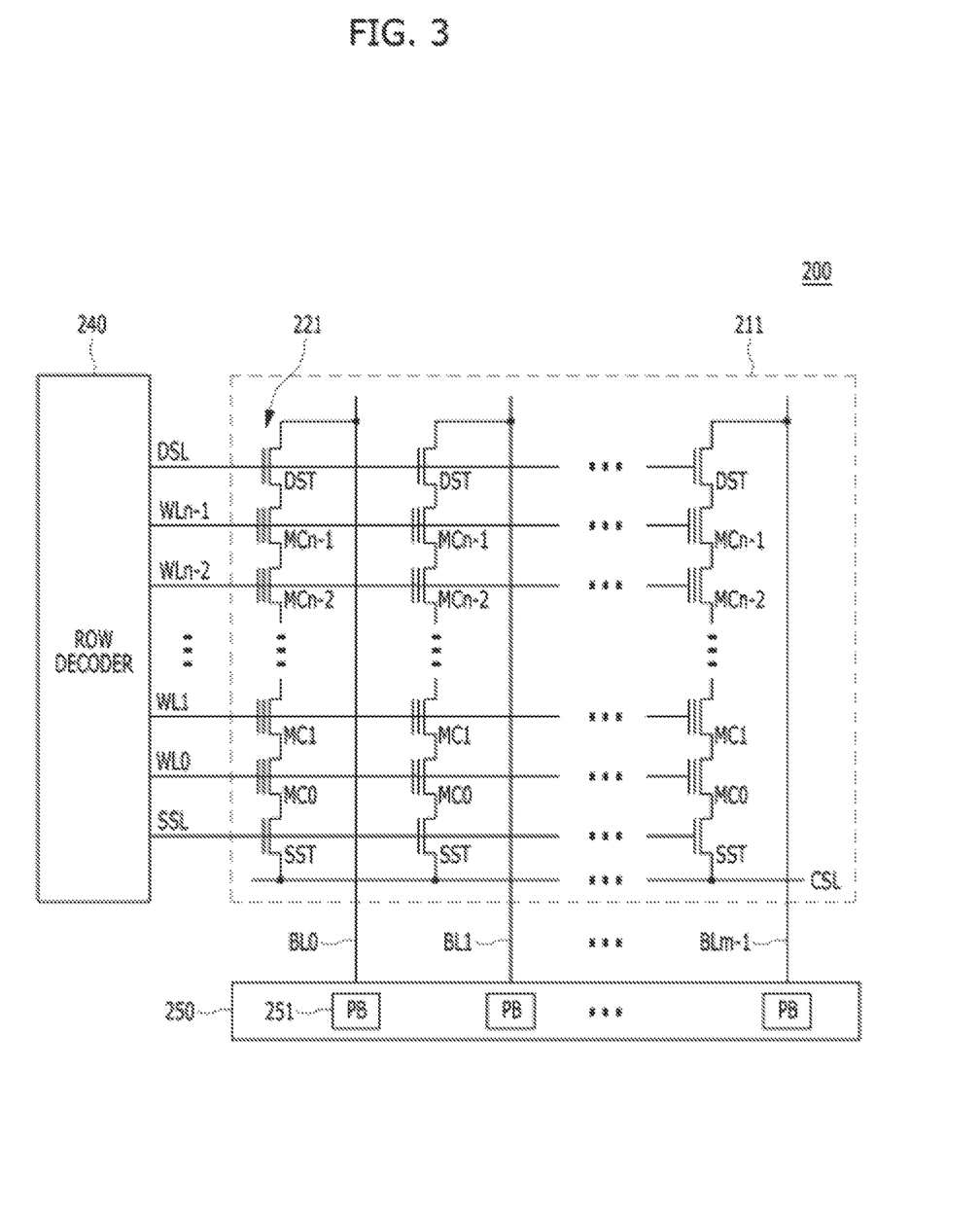
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Accumulated read disturb errors are one of the major sources of flash errors. When the cells on the wordline are read, the cells on the other, neighbor wordlines in the same block will be disturbed by the relative high $V_{pass}$ voltage applied during read operation. Although one read operation has very small impact on neighbor wordlines, the accumulated reads over time can eventually introduce enough errors so that the total number of errors will be larger than the ECC error correction capability and cause uncorrectable errors and data loss.

The read disturb errors can be overcome by flash correct and refresh. The main ideas are to read data from flash memory before the flash media accumulates too many errors than ECC can correct, leverage the ECC engine in flash controller to correct these errors, and reprogram the error free data into flash memory. Here, one key question is when to reclaim the data under read disturb before the errors become uncorrectable.

Disclosed herein are systems, methods, processes and devices that achieve both the counter storage overhead and high accuracy to allow system to identify wordlines (e.g., wordlines that are "hot", frequently read) so that their neighbor wordline(s) can be checked to decide whether to reclaim the data in the block due to read disturb. Each block/superblock may maintain a counter to record the number of reads hit to that block/superBlock as existing per block or per SuperBlock solution. Per wordline read information (e.g., information associated with each word line, such as number of reads per wordline) is only created for those hot blocks with the read count larger than a block read count threshold. As not all blocks are read hot blocks and only some percentage of blocks will have the read count larger than the block read count threshold prior to initiation, the overhead to record per wordline read count information is low.

Thus, per wordline information can be adaptively created. Per wordline information will be deleted to save space once the data in the corresponding block/superblock is reclaimed. It can achieve low storage overhead while still maintaining per wordline information for those blocks that need to check read disturb errors and decide whether to reclaim the data. The other blocks that do not have per wordline read information are blocks with low read frequency and are not necessary to check read disturb errors.

Figure 4:
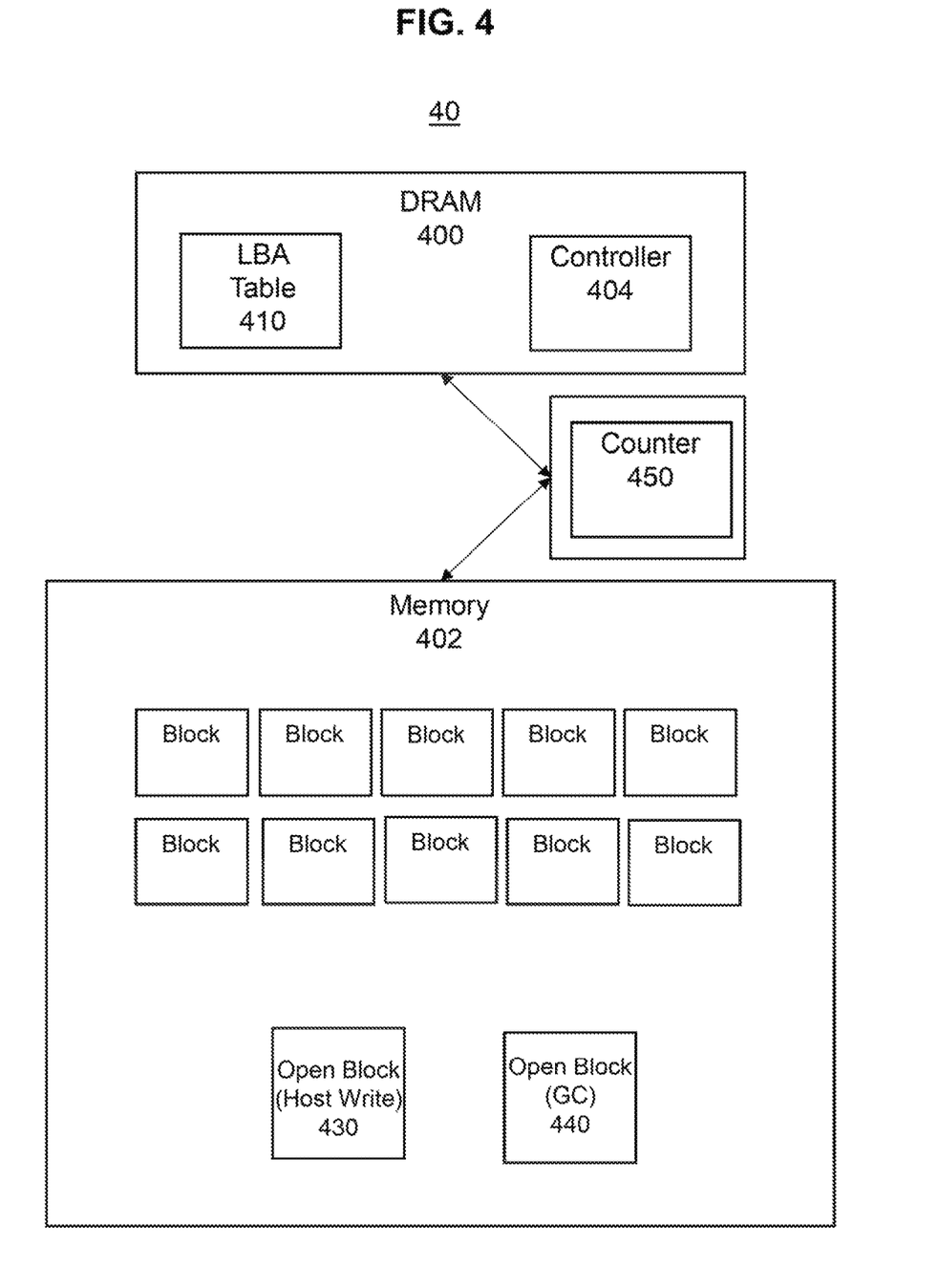
FIG. 4 is a diagram of an example system according to aspects of the invention.

Referring to FIG. 4, an example system 40 for managing read disturb is shown. The system 40 includes a volatile memory (DRAM) 400 and a memory 402. The DRAM 400 may include an LBA table 410 and a controller 404, such as the controllers described above. The memory 402 may include a plurality of blocks/super blocks, an open block for host writes 430 and an open block for garbage collection 440. The system 40 also includes at least one counter 450. The counter 450 may be housed on the memory 402 and/or the DRAM 400, or alternatively, on a separate storage. In addition, the system 40 may include a plurality of counters. Each of the plurality of counters may be associated with one of the plurality of blocks (e.g., a 1-to-1 association). The counters may be maintained at each block in the memory 402, on the DRAM 400 (e.g., via the controller 404), alternative storage, or any combination thereof.

Figure 5:
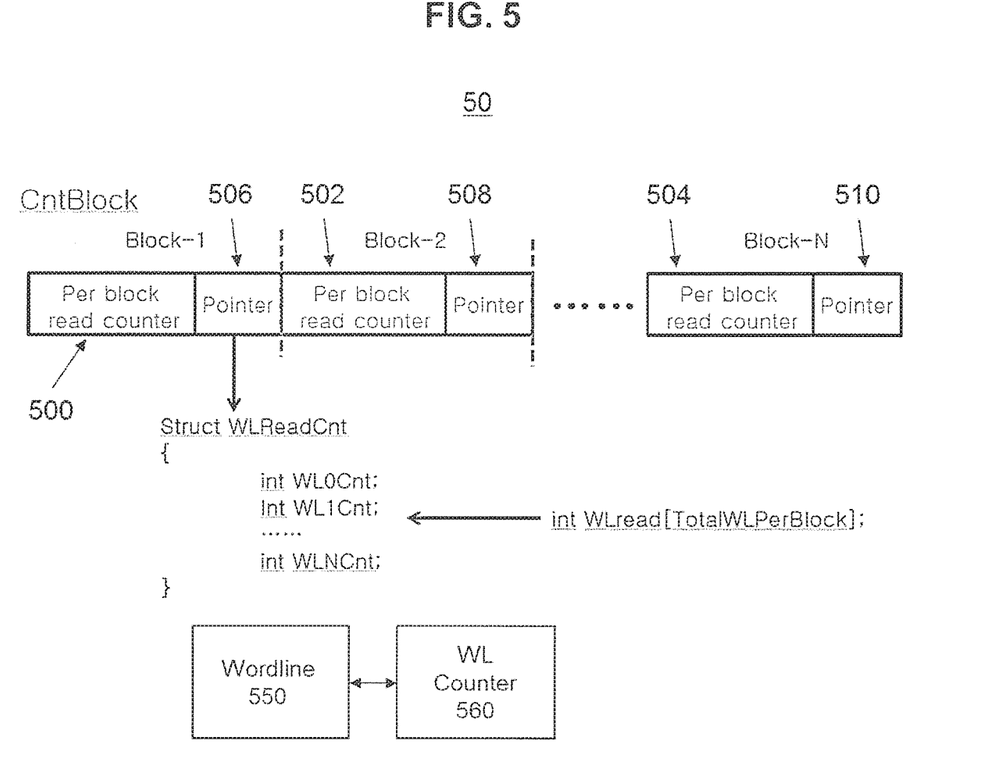
FIG. 5 is a diagram of an example system in accordance with aspects of the invention.

An additional example of a memory system structure is shown in FIG. 5. The system/structure 50 may include read counters 500, 502, 504 each associated with a block and a plurality of pointers 506, 508, 510. Although three counters and pointers are depicted, it is understood that more blocks may be implemented in the system 50, thereby increasing the number of counters and pointers. The structure 50 may be configured as an array.

The structure 50 may be configured to manage the read counts and may be organized as a per-block array with optional per wordline read structures. The entry of the array corresponds to one block/SuperBlock. The index of the entry of the array is the address number of the block/superBlock. Thus, it would be easy and fast to fetch the information of each block/superBlock given its address. Each entry of the block has two values. One is an integer to count the number of reads hit to the block. The other is a pointer that points to a structure to record per wordline information of the block. Such pointer can be NULL for non-hot blocks and it can be a real pointer to a per wordline information structure for those hot blocks. Thus, the pointers 506, 508, and 510 may point to an alternative storage or partition (not shown) to begin storing per wordline information (or to update per wordline information) when the number of reads on the block counted by the counters (e.g., counter 500, 502, 504) exceeds a block read count threshold. The per wordline structure may maintain a counter to count the number of reads hit to each wordline of the corresponding block. For example, each wordline (e.g., wordline 550) may have a counter (WL counter 560) associated with it to count a number of reads to the wordline.

The systems, methods, processes and devices disclosed herein keep recording the read count hit to each block while dynamically creating the per wordline read information for some percentage of hot-read blocks as only hot-read blocks need read disturb checking. The additional storage overhead required is small but provides accurate checking of the direct neighbor of wordlines selected (e.g., hot, or hottest wordlines) in the block.

In an embodiment, the length of per block/superblock read count array may be the total number of blocks or superblocks. The number of reads hit to each block/superblock (perBlkCnt) is initialized to zero. The pointer of each block is initialized (perPt) to NULL. The pseudo code of the block structure initialization is illustrated as follows:

```
for(i=0; i<TotalBlocks; i++)
{
CntBlock[i].perBlkCnt = 0;
CntBlock[i].perPt = NULL;
}
```

Figure 6:
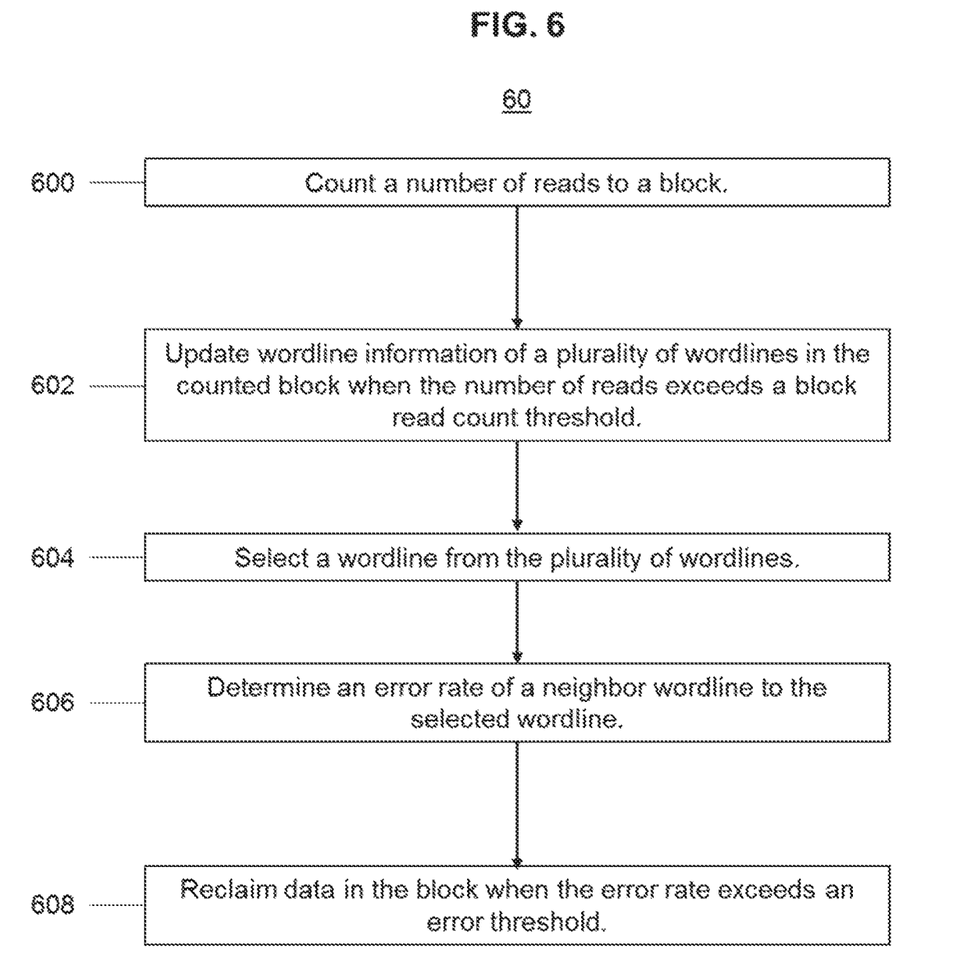
FIG. 6 is a flowchart of steps for read disturb management in accordance with aspects of the invention.

Referring next to FIG. 6, a flowchart 60 of steps for managing read disturb is shown in accordance with aspects of the invention. At step 600, a number of reads to a block is counted. The number of reads may be counted by a counter (e.g., a counter associated with the block, via a controller, etc.) Each time a read hits the block, a total number of reads of the block may be increased by one. The pseudo code may be CntBlock[BlockNum].perBlkCnt++. Here, BlockNum is the number of block or superBlock.

At step 602, wordline information of a plurality of wordlines in the counted block is updated when the number of reads exceeds a block read count threshold. For example, the wordline information is updated as a result of the pointers as described above. The block read count threshold may be based on a number of reads in a read reclaim check period. In an embodiment, the block read count threshold is set to about half of the number of reads in a read reclaim check period. For example, the block read count threshold may be set to 5K if the number of reads in the read reclaim check period is 10K. Other suitable values for the block read count threshold will be understood by those of skill in the art from the description herein.

If the total number of reads to the block is lower than the threshold, per wordline information is not updated and the block is set to be ready to serve the next commands. Otherwise, the information is updated. In an embodiment, if the pointer of block is NULL (e.g., first time that the total reads is larger than a block read count threshold), a per wordline data structure of the block needs to be created (e.g., a storage or partition. Two sub procedures may be executed. In the first, a data structure is created to record per wordline information. The pseudo code may be WLpt=malloc(sizeof (struct WLReadCnt). In the second, the newly created data structure is connected to the block. The pseudo code may be CntBlock[BlockNum].perPt=pW.

If the block already has a per wordline data structure, the per wordline information may be updated by getting a wordline number from the read page address (e.g., pseudo code: WLNum=page2WL(PageNum)) and increasing a counter corresponding to the wordline (e.g., pseudo code: CntBlock[BlockNum].perPt->WLRead[WLNum]++).

At step 604, a ward line from the plurality of wordlines is selected. The wordline may be selected when the number of reads meets the number of reads in the read reclaim check period. The wordline selected may be the hottest wordline of the block. The wordline may be selected probabilistically. For example, the firmware may generate a random number (e.g., a random number uniformly distributed between [0,1]). If the number p is larger than a predetermined value (e.g., p may be set to 0.1% or 0.005%, etc.), the process may be ended without any reclaim. If the number is smaller than the predetermined value, the wordline with the largest number of reads (e.g., the hottest wordline) may be selected (e.g., the hottest wordline may be h, where h=searchHottestWL(CntBlock[BlockNum].perPt)). The predetermined value may be adjusted accordingly in order to effectuate the invention.

At step 606, an error rate of a neighbor wordline to the selected wordline is determined. The neighbor wordline may be wordline h+1 or h−1 in embodiments where the hottest wordline h is selected. If the selected wordline is a top or bottom wordline, then the selected wordline will have only one neighbor.

At step 608, data in the block is reclaimed if the error rate of the neighbor wordline is determined to exceed an error threshold. The error threshold may be set to a value of acceptable error rate of the neighbor wordline.

Figure 7:
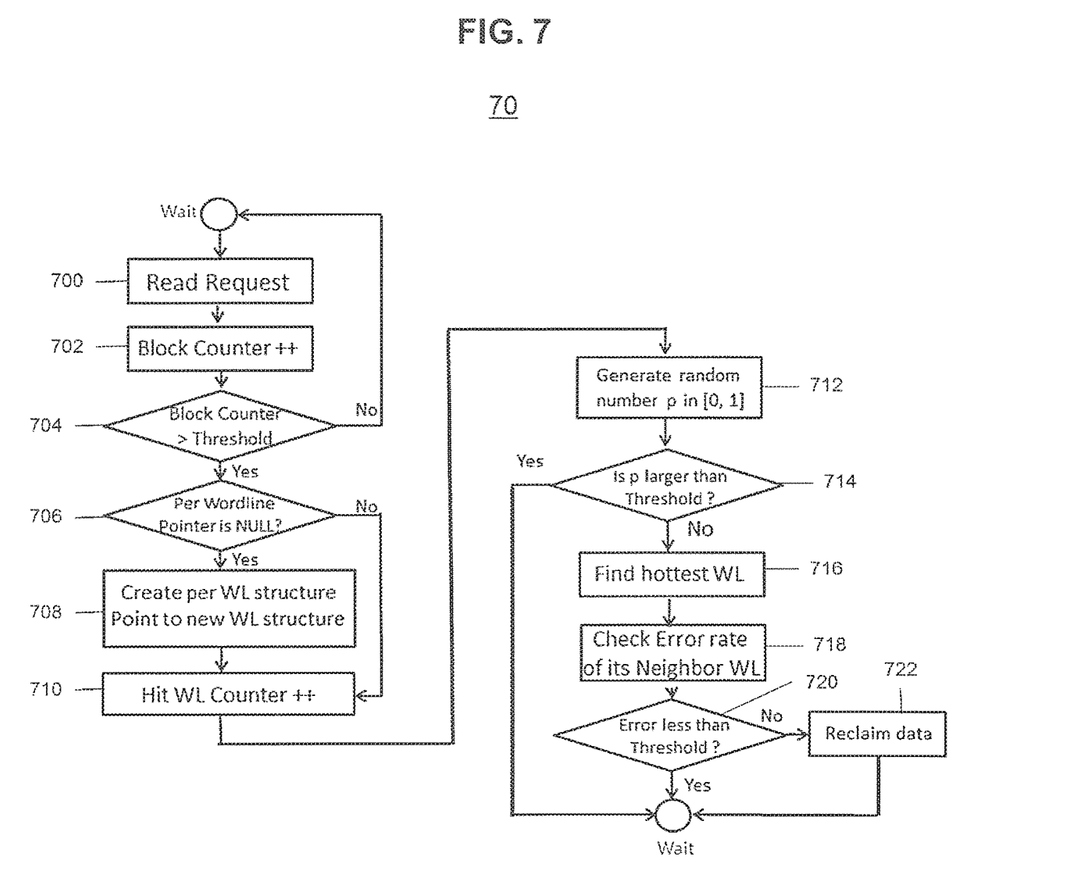
FIG. 7 is a algorithmic flowchart of steps in a process for read disturb management according to aspects of the invention.

FIG. 7 is an example algorithm 70 for the processes described above. For example, at the start, a read request 700 may be received and a counter for the block may be incremented 702. These steps 700 and 702 are repeated if the value of the block counter does not exceed a block read count threshold (checked at 704). If the block read count threshold is exceeded, it is determined at 706 whether the per wordline pointer is set to NULL. If not, the WL counter is incremented at 710. If so, then the WL data structure is created and is then pointed to at 708. Next, at 712, a random number may be generated and it is determined, at 714, if it is larger than a threshold (e.g., a predetermined value). If it is not larger, the hottest wordline may be found at 716 (or other wordline, such as a wordline that has a temperature above or below a temperature threshold), the error rate of the neighbor wordline to the hottest wordline may be determined at 718, and it is then determined whether the error rate is less than an error threshold at 720. If not, data in the block is reclaimed at 722. If so, the process may end without reclaiming. If the random number is larger than the predetermined value at 714, the process may end without reclaim.

Once a block is refreshed (e.g., reclaiming proceeds), the read counters may be managed by releasing per wordline information of the block (e.g., free(CntBlock[BlockNum].perPt)), resetting the per wordline pointer of the block to be NULL (e.g., CntBlock[BlockNum].perPt=NULL), and resetting the read counter associated with the block to be zero (e.g., CntBlock[BlockNum].perBlkCnt=0).

Particular examples are disclosed and discussed below. These examples are exemplary and not exclusive, and are provided for illustrative and explanatory purposes of the invention disclosed herein.

In an example of a hybrid read count management system, the basic storage per one block is a 4-Byte integer for counting the number of reads to the block and 4-Byte pointer to point per wordline counter structure or simply to be NULL. If a block has its own per wordline structure, each wordline has a 4-Byte integer to count the number of reads hit to the wordline. The total storage overhead for per wordline information for each block is 4B multiplied by the number of wordlines per block. Assume the percentage of hot-read blocks to be HotBlkPercentage and these blocks have per wordline information. Thus, the total counters per SSD would be 8*TotalBlockNum+
    4*WLNum*TotalBlockCount*HotBlkPercentage.

This formula may be used to estimate the storage overhead. If the solution is managed as hybrid block and wordline, the storage overhead is as illustrated in Table 1 below.

TABLE 1

| | Storage Overhead |
|---|---|
| Baseline per Block solution | 1 MB |
| Baseline per Wordline solution | 128 MB |
| Hybrid (1% hot) | 3.28 MB |
| Hybrid (5% hot) | 8.4 MB |
| Hybrid (10% hot) | 14.8 MB |
| Hybrid (20% hot) | 27.6 MB |
| Hybrid (50% hot) | 66 MB |
| Hybrid (100% hot) | 130 MB |

If the solution is managed as hybrid super block and super wordline, the storage overhead is as illustrated in table 2 below.

TABLE 2

| | Storage Overhead |
|---|---|
| Baseline per SuperBlock solution | 0.032 MB |
| Baseline per SuperWordline solution | 4 MB |
| Hybrid (1% hot) | 0.1 MB |
| Hybrid (5% hot) | 0.26 MB |
| Hybrid (10% hot) | 0.46 MB |
| Hybrid (20% hot) | 0.86 MB |
| Hybrid (50% hot) | 2.06 MB |
| Hybrid (100% hot) | 4.06 MB |

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device comprising:
    a semiconductor memory having memory blocks; and
    a memory controller programmed to:
        count a number of reads to each of the memory blocks;
        allocate storage for storing read information associated with a subset of the memory blocks, each memory block in the subset of the memory blocks satisfying a read disturb check criteria;
        select a wordline of a memory block in the subset of the memory blocks;
        determine that an error rate for memory cells connected to a neighbor wordline of the selected wordline exceeds an error threshold; and
        reclaim data in the memory block containing the selected wordline in response to determining that the error rate exceeds the error threshold.

2. The device of claim 1, wherein the error rate for the memory cells connected to the neighbor wordline is determined when a comparison result between a randomly generated number and a threshold value satisfies a predetermined condition.

3. The device of claim 1, wherein the memory controller is further programmed to deallocate the allocated storage associated with the memory block after reclaiming the data in the memory block.

4. The device of claim 1, wherein the read disturb check criteria is satisfied when a count of the number of reads to the memory block exceeds a block read count threshold.

5. The device of claim 1, wherein the read information being stored in the allocated storage includes wordline read information.

6. The device of claim 1, wherein the memory controller is further programmed to store a count of the number of reads to each of the memory blocks in a data structure, the data structure having an entry for each of the memory blocks, wherein each entry includes a read counter field to store the count of the number of reads and a pointer field initialized to a null value.

7. The device of claim 6, wherein the memory controller is further programmed to update the pointer field to point to the allocated storage for storing the read information of a corresponding memory block.

8. A method comprising:
counting a number of reads to a memory block of a semiconductor memory;
allocating storage for storing read information associated with the memory block;
determining that the memory block is subject to a data reclaim process based on a random number generated by firmware;
selecting a wordline of the memory block;
determining whether an error rate for memory cells connected to a neighbor wordline of the selected wordline exceeds an error threshold; and
reclaiming data in the memory block in response to determining that the error rate exceeds the error threshold.

9. The method of claim 8, further comprising deallocating the storage for storing read information associated with the memory block after reclaiming the data in the memory block.

10. The method of claim 8, wherein the read information being stored includes a count of a number of reads to the wordline being selected.

11. The method of claim 8, wherein the wordline being selected has the largest number of reads among wordlines of the memory block.

12. The method of claim 8, further comprising:
storing a count of the number of reads to the memory block in a data structure; and
storing a pointer to the allocated storage in the data structure.

13. The method of claim 12, further comprising:
setting the pointer to a null value after reclaiming the data in the memory block.

14. A device comprising:
a semiconductor memory; and
a controller programmed to:
count a number of reads to a memory block of the semiconductor memory;
determine that the memory block is subject to a data reclaim process based on a random number generated by firmware;
determine whether a read disturb level of memory cells connected to a wordline of the memory block exceeds a threshold; and
reclaim data in the memory block in response to determining that the read disturb level exceeds the threshold.

15. The device of claim 14, wherein the controller is further programmed to:
allocate storage for storing read information associated with the memory block; and
deallocate the storage after reclaiming the data in the memory block.

16. The device of claim 15, wherein the read information being stored includes a count of the number of reads to one or more wordlines of the memory block.

17. The device of claim 14, wherein the wordline is a neighbor wordline of a wordline having the largest number of reads among wordlines of the memory block.

18. The device of claim 14, wherein the controller is further programmed to:
store a count of the number of reads to the memory block in a data structure having an entry per memory block of the semiconductor memory.

19. The device of claim 18, wherein the data structure is stored in the semiconductor memory.

20. The device of claim 18, wherein the data structure is stored in a memory external to the semiconductor memory.

* * * * *